(12) United States Patent
Doyle et al.

(10) Patent No.: US 9,239,489 B2
(45) Date of Patent: Jan. 19, 2016

(54) DISPLAY BACKLIGHT WITH CLOSELY SPACED LIGHT-EMITTING DIODE PACKAGES

(75) Inventors: David A. Doyle, San Francisco, CA (US); Shawn R. Gettemy, San Jose, CA (US)

(73) Assignee: Apple Inc., Cupertino, CA (US)

( * ) Notice: Subject to any disclaimer, the term of this patent is extended or adjusted under 35 U.S.C. 154(b) by 671 days.

(21) Appl. No.: 13/568,949

(22) Filed: Aug. 7, 2012

(65) Prior Publication Data

US 2014/0036204 A1    Feb. 6, 2014

Related U.S. Application Data

(60) Provisional application No. 61/678,062, filed on Jul. 31, 2012.

(51) Int. Cl.
*G02F 1/1335* (2006.01)
*F21V 8/00* (2006.01)

(52) U.S. Cl.
CPC .......... *G02F 1/133608* (2013.01); *G02B 6/002* (2013.01); *G02B 6/0035* (2013.01); *G02B 6/0055* (2013.01); *G02F 2001/133612* (2013.01)

(58) Field of Classification Search
USPC ............................... 349/65, 66, 58
See application file for complete search history.

(56) References Cited

U.S. PATENT DOCUMENTS

| | | | |
|---|---|---|---|
| 5,864,377 A * | 1/1999 | Kim | 349/150 |
| 5,883,684 A * | 3/1999 | Millikan et al. | 349/65 |
| 6,064,455 A * | 5/2000 | Kim | 349/113 |
| 7,400,439 B2 | 7/2008 | Holman | |
| 8,245,522 B2 * | 8/2012 | Ok | 62/125 |
| 8,248,560 B2 | 8/2012 | Kim et al. | |
| 2002/0126238 A1 * | 9/2002 | Matsushita et al. | 349/106 |
| 2002/0135824 A1 * | 9/2002 | Saito | 358/509 |
| 2005/0259939 A1 | 11/2005 | Rinko | |
| 2008/0159693 A1 | 7/2008 | Chang | |
| 2008/0191231 A1 | 8/2008 | Park et al. | |
| 2008/0296592 A1 * | 12/2008 | Osamu | 257/89 |
| 2011/0199787 A1 | 8/2011 | Kim et al. | |

(Continued)

FOREIGN PATENT DOCUMENTS

| | | |
|---|---|---|
| CN | 1997922 | 7/2007 |
| CN | 102478172 A | 5/2012 |
| CN | 102479910 A | 5/2012 |
| KR | 10-0713180 B1 | 5/2007 |
| TW | 200827852 | 7/2008 |
| TW | 201230419 | 7/2012 |

*Primary Examiner* — Lucy Chien
(74) *Attorney, Agent, or Firm* — Treyz Law Group, P.C.; G. Victor Treyz; Joseph F. Guihan

(57) ABSTRACT

An electronic device may be provided with a display having backlight structures that include a light guide plate formed from a clear polymer film. The polymer film may have an edge into which light is emitted from an adjacent array of light-emitting diodes. The light emitting diodes may each include a semiconductor device that emits light. The semiconductor device in each diode may be mounted on lead frame structures and wirebonded to the lead frame structures with first and second wire bonds. To improve backlight homogeneity and thereby reduce the mixing distance for light in the light guide plate, the diodes may be spaced closely together using diode packages having end faces that are free of lead frame structures. Exposed lead frame structures for soldering the light-emitting diodes to a substrate may be formed under the light-emitting diodes and on rear surfaces of the light-emitting diodes.

25 Claims, 17 Drawing Sheets

(56) References Cited

U.S. PATENT DOCUMENTS

| | | |
|---|---|---|
| 2011/0316766 A1 | 12/2011 | Kubota et al. |
| 2012/0018764 A1 | 1/2012 | Choi et al. |
| 2012/0120671 A1 | 5/2012 | Yamashita et al. |
| 2012/0126266 A1 | 5/2012 | Watari et al. |
| 2012/0132931 A1 | 5/2012 | Inoue et al. |
| 2013/0039092 A1* | 2/2013 | Cho et al. ............... 362/612 |

* cited by examiner

DISPLAY BACKLIGHT WITH CLOSELY SPACED LIGHT-EMITTING DIODE PACKAGES

This application claims the benefit of provisional patent application No. 61/678,062, filed Jul. 31, 2012, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user. An electronic device may have a housing such as a housing formed from plastic or metal. Components for the electronic device such as display components may be mounted in the housing.

It can be challenging to incorporate a display into the housing of an electronic device. Size and weight are often important considerations in designing electronic devices. If care is not taken, displays may be bulky or may be surrounded by overly large borders.

It would therefore be desirable to be able to provide improved backlit displays for electronic devices.

SUMMARY

An electronic device may be provided with a display that has display layers such as a layer of liquid crystal material interposed between a color filter layer and a thin-film-transistor layer. The color filter layer, liquid crystal layer, and thin-film transistor layer may be interposed between upper and lower polarizers.

Backlight structures may be used to provide backlight that passes through the display layers. The backlight structures may include a light guide plate formed from injection molded plastic or a clear polymer film. The light guide plate may have an edge into which light is emitted from an adjacent array of light-emitting diodes.

The light emitting diodes may each include a semiconductor device that emits light. The semiconductor device in each diode may be mounted on lead frame structures in a molded plastic package or may be formed as a portion of a chip-on-board package with attached light redirecting structures.

In configurations in which the semiconductor device is mounted on lead frame structures, the semiconductor device may be electrically connected to the lead frame structures using first and second wire bonds or using solder bumps on a bottom surface of the semiconductor device.

In configurations in which the semiconductor device is formed as a portion of a chip-on-board package with attached light redirecting structures, the attached light redirecting structures may be attached to a substrate using adhesive. The attached light redirecting structures may include ceramic, metal, plastic, or resin wall structures that at least partially surround the semiconductor device. In this type of configuration, the semiconductor device may be electrically connected to the electrical contacts on the substrate using wire bonds.

Light from each diode may be emitted through a window in the molded plastic package or the chip-on-board package. The window may occupy a relatively large portion of the front face of a package and may contain a phosphorescent filler material.

To improve backlight homogeneity and thereby reduce the mixing distance for light in the light guide plate, the diodes may be spaced closely together using diode packages having end faces that are free of lead frame structures. Lead frame structures for the light-emitting diodes may be formed under the light-emitting diodes and on rear surfaces of the light-emitting diodes. The exposed lead frame structures may be soldered to solder pads on a dielectric substrate.

Further features of the invention, its nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, and 3.

Figure 1:
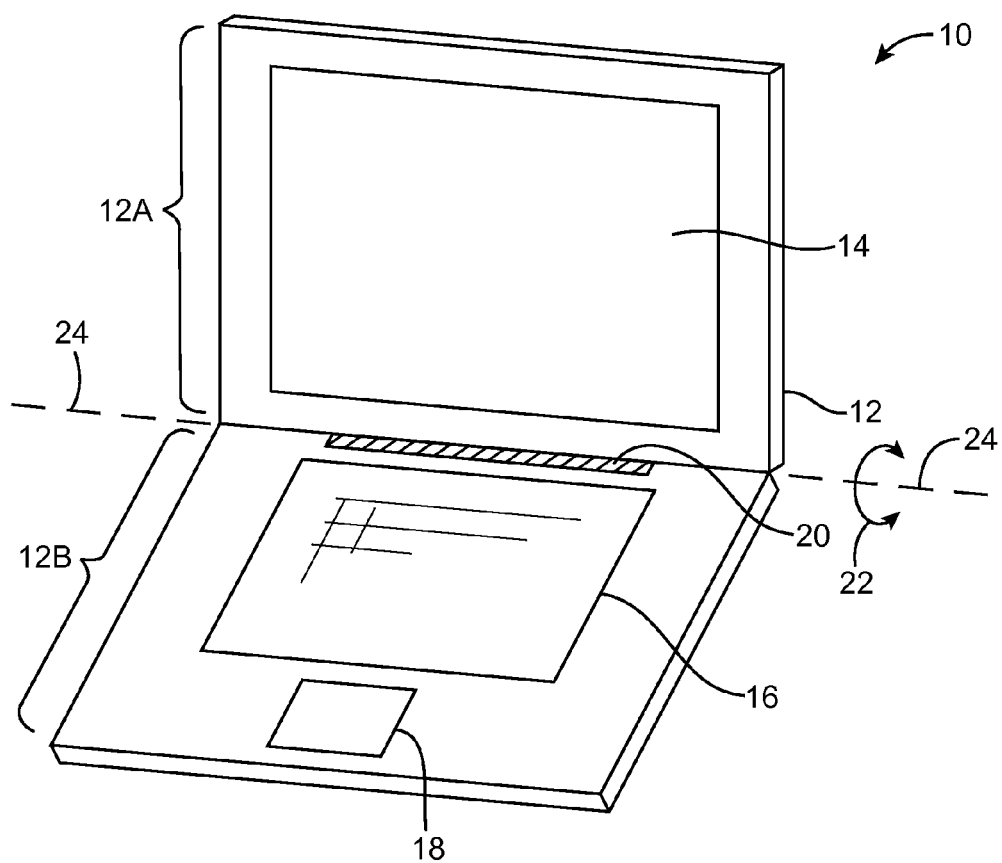
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
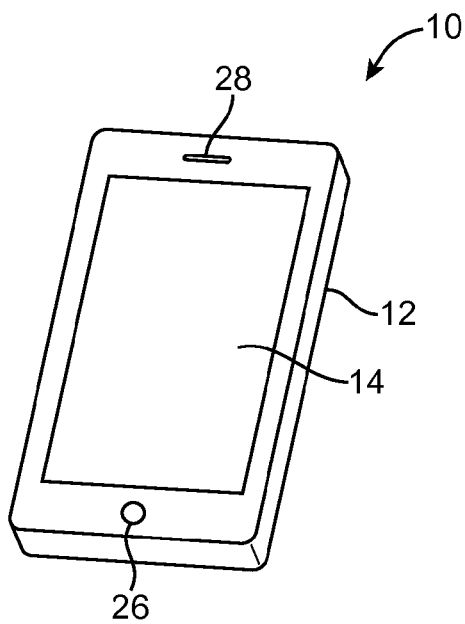
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have a display cover layer or other exterior layer that includes openings for components such as button 26. Openings may also be formed in a display cover layer or other display layer to accommodate a speaker port (see, e.g., speaker port 28 of FIG. 2).

Figure 3:
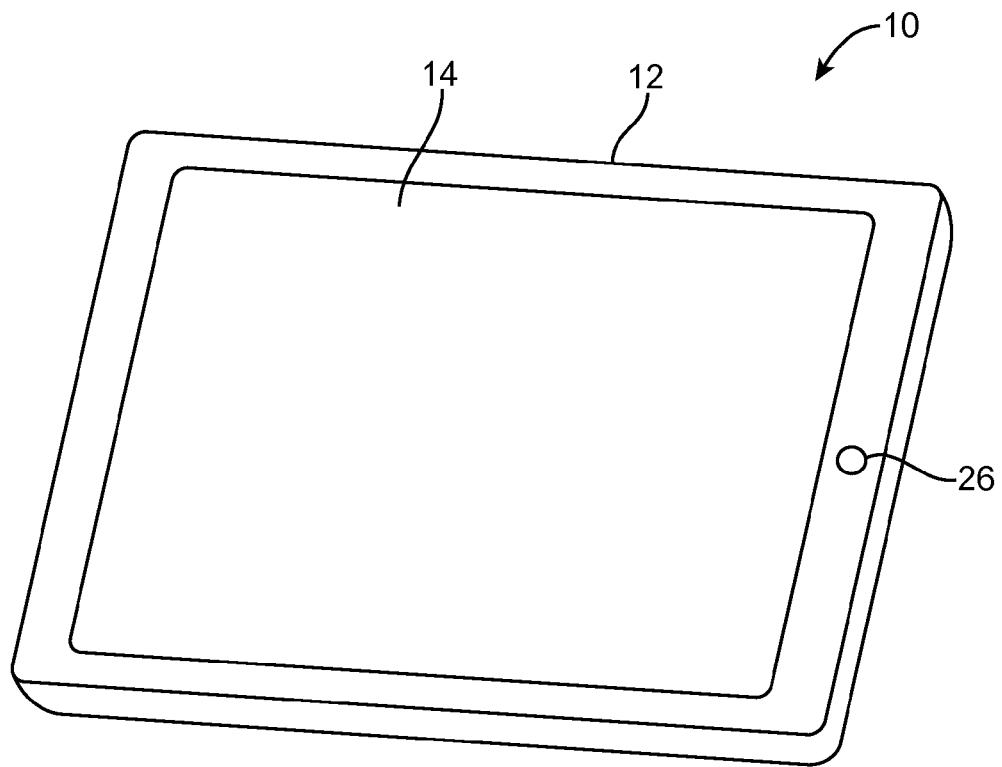
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have a cover layer or other external layer (e.g., a color filter layer or thin-film-transistor layer) with an opening to accommodate button 26 (as an example).

The illustrative configurations for device 10 that are shown in FIGS. 1, 2, and 3 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use LCD components to form display 14, so configurations for display 14 in which display 14 is a liquid crystal display are sometimes described herein as an example. It may also be desirable to provide displays such as display 14 with backlight structures, so configurations for display 14 that include a backlight unit may sometimes be described herein as an example. Other types of display technology may be used in device 10 if desired. The use of liquid crystal display structures and backlight structures in device 10 is merely illustrative.

A display cover layer may cover the surface of display 14 or a display layer such as a color filter layer, thin-film transistor layer or other portion of a display may be used as the outermost (or nearly outermost) layer in display 14. For example, a color filter layer or thin-film transistor layer that is covered by a polarizer layer may form the outermost layer for device 10. A display cover layer or other outer display layer may be formed from a transparent glass sheet, a clear plastic layer, or other transparent member.

Touch sensor components such as an array of capacitive touch sensor electrodes formed from transparent materials such as indium tin oxide may be formed on the underside of a display cover layer, may be formed on a separate display layer such as a glass or polymer touch sensor substrate, or may be integrated into other display layers (e.g., substrate layers such as a thin-film transistor layer).

Figure 4:
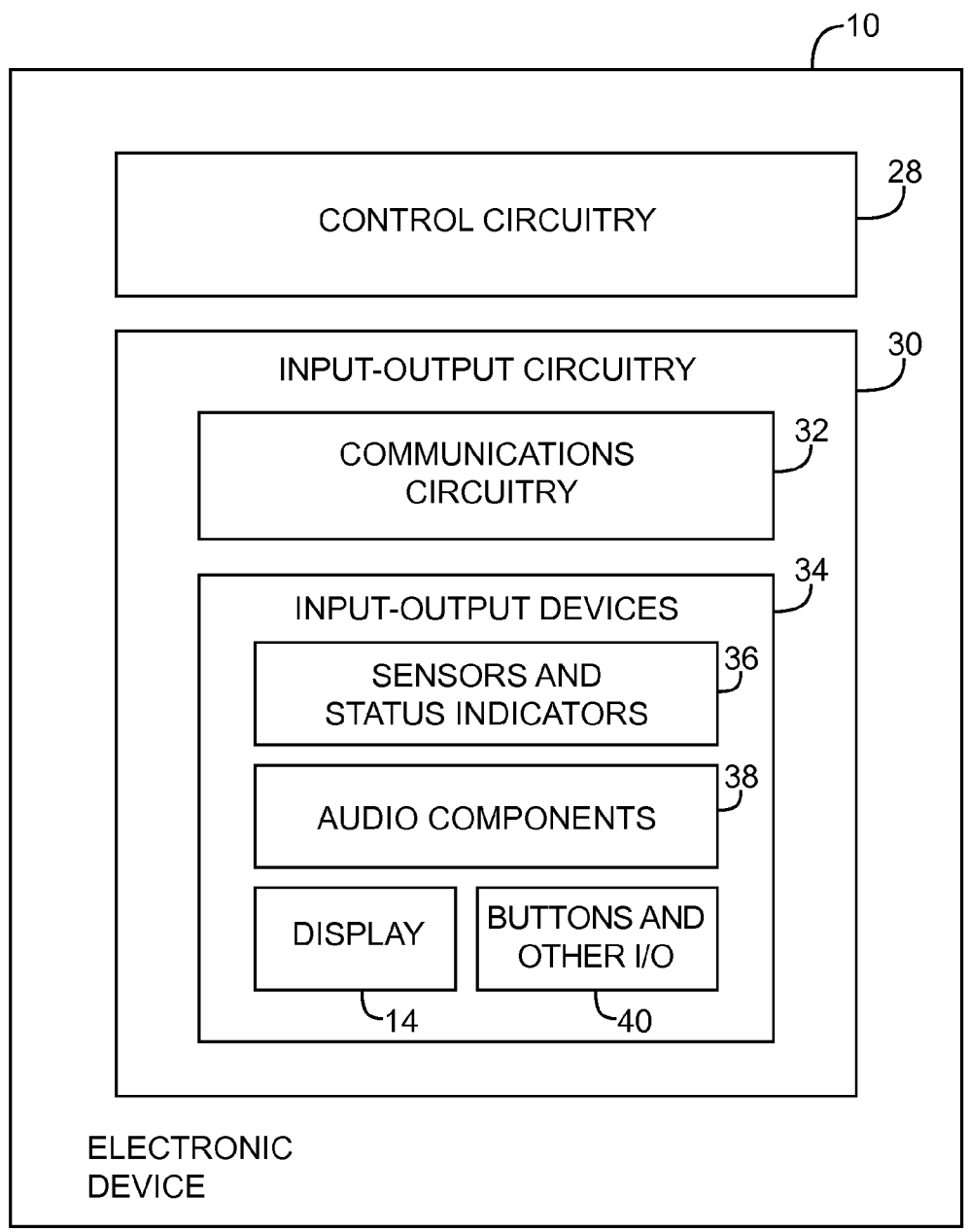
FIG. 4 is a schematic diagram of an illustrative electronic device with a display in accordance with an embodiment of the present invention.

A schematic diagram of an illustrative configuration that may be used for electronic device 10 is shown in FIG. 4. As shown in FIG. 4, electronic device 10 may include control circuitry 28. Control circuitry 28 may include storage and processing circuitry for controlling the operation of device 10. Control circuitry 28 may, for example, include storage such as hard disk drive storage, nonvolatile memory (e.g., flash memory or other electrically-programmable-read-only memory configured to form a solid state drive), volatile memory (e.g., static or dynamic random-access-memory), etc. Control circuitry 28 may include processing circuitry based on one or more microprocessors, microcontrollers, digital signal processors, baseband processors, power management units, audio codec chips, application specific integrated circuits, etc.

Control circuitry 28 may be used to run software on device 10, such as operating system software and application software. Using this software, control circuitry 28 may present information to a user of electronic device 10 on display 14. When presenting information to a user on display 14, sensor signals and other information may be used by control circuitry 28 in making adjustments to the strength of backlight illumination that is used for display 14.

Input-output circuitry 30 may be used to allow data to be supplied to device 10 and to allow data to be provided from device 10 to external devices. Input-output circuitry 30 may include communications circuitry 32. Communications circuitry 32 may include wired communications circuitry for supporting communications using data ports in device 10. Communications circuitry 32 may also include wireless communications circuits (e.g., circuitry for transmitting and receiving wireless radio-frequency signals using antennas).

Input-output circuitry 30 may also include input-output devices 34. A user can control the operation of device 10 by supplying commands through input-output devices 34 and may receive status information and other output from device 10 using the output resources of input-output devices 34.

Input-output devices 34 may include sensors and status indicators 36 such as an ambient light sensor, a proximity sensor, a temperature sensor, a pressure sensor, a magnetic sensor, an accelerometer, and light-emitting diodes and other components for gathering information about the environment in which device 10 is operating and providing information to a user of device 10 about the status of device 10.

Audio components 38 may include speakers and tone generators for presenting sound to a user of device 10 and microphones for gathering user audio input.

Display 14 may be used to present images for a user such as text, video, and still images. Sensors 36 may include a touch sensor array that is formed as one of the layers in display 14.

User input may be gathered using buttons and other input-output components 40 such as touch pad sensors, buttons, joysticks, click wheels, scrolling wheels, touch sensors such as sensors 36 in display 14, key pads, keyboards, vibrators, cameras, and other input-output components.

Figure 5:
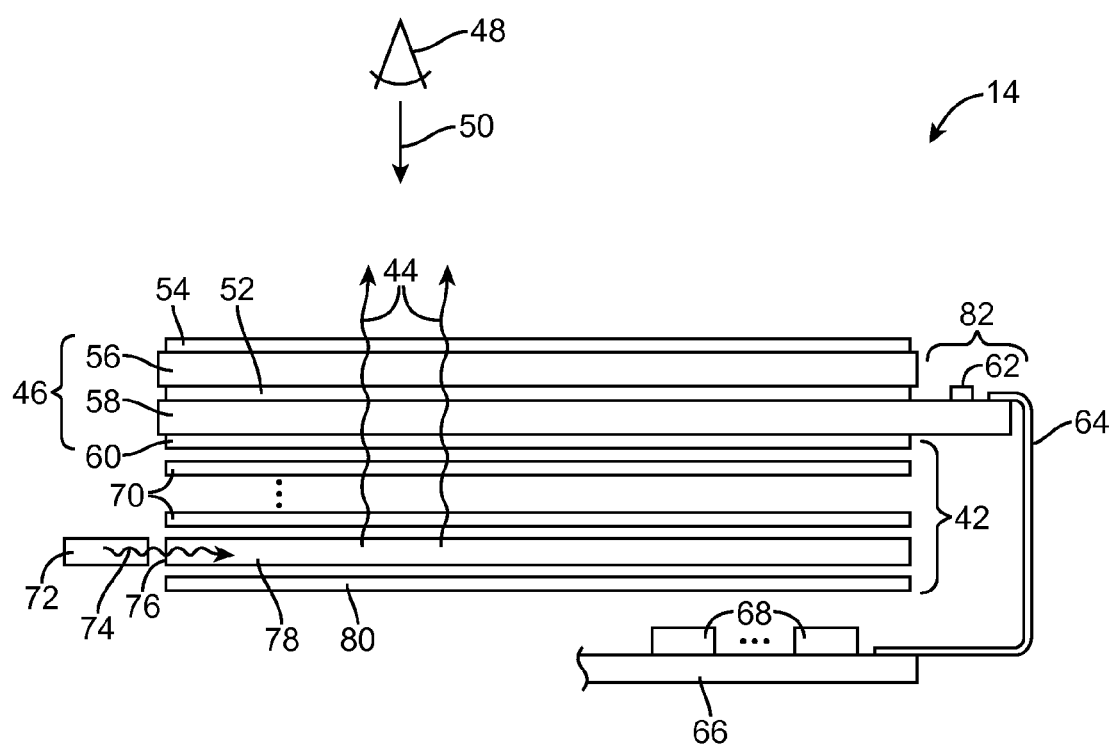
FIG. 5 is a cross-sectional side view of an illustrative display in accordance with an embodiment of the present invention.

A cross-sectional side view of an illustrative configuration that may be used for display 14 of device 10 (e.g., for display 14 of the devices of FIG. 1, FIG. 2, or FIG. 3 or other suitable electronic devices) is shown in FIG. 5. As shown in FIG. 5, display 14 may include backlight structures such as backlight unit 42 for producing light such as backlight 44. During operation, backlight 44 travels outwards (vertically upwards in the orientation of FIG. 5) and passes through display pixel structures in display layers 46. This illuminates any images that are being produced by the display pixels for viewing by a user. For example, backlight 44 may illuminate images in display layers 46 that are being viewed by viewer 48 in direction 50.

Display layers 46 and/or backlight structures 42 may be mounted in chassis structures such as a plastic chassis structure and/or a metal chassis structure to form a display module for mounting in housing 12 or display layers 46 and/or backlight structures 42 may be mounted directly in housing 12 (e.g., by stacking display layers 46 and/or backlight structures 42 into a recessed portion in housing 12). Display layers 46 and/or backlight structures 42 may form a liquid crystal display or may be used in forming displays of other types (e.g., field sequential color (FSC) displays that pulse colored light of various colors from the backlight structures into individual, fast pixels).

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. If desired, the positions of color filter layer 56 and thin-film-transistor layer 58 may be inverted so that the thin-film-transistor layer is located above the color filter layer.

During operation of display 14 in device 10, control circuitry 28 (e.g., one or more integrated circuits such as components 68 on printed circuit 66 of FIG. 5) may be used to generate information to be displayed on display 14 (e.g., display data). The information to be displayed may be conveyed from circuitry 68 to display driver integrated circuit 62 using a signal path such as a signal path formed from conductive metal traces in flexible printed circuit 64 (as an example).

Display driver integrated circuit 62 may be mounted on thin-film-transistor layer driver ledge 82 or elsewhere in device 10. A flexible printed circuit cable such as flexible printed circuit 64 may be used in routing signals between printed circuit 66 and thin-film-transistor layer 60. If desired, display driver integrated circuit 62 may be mounted on printed circuit 66 or flexible printed circuit 64. Printed circuit 66 may be formed from a rigid printed circuit board (e.g., a layer of fiberglass-filled epoxy) or a flexible printed circuit (e.g., a flexible sheet of polyimide or other flexible polymer layer).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes.

Light 74 from light source 72 may be coupled into edge surface 76 of light guide plate 78 and may be distributed laterally throughout light guide plate 78 due to the principal of total internal reflection. Light guide plate 78 may include light-extracting features such as pits or bumps. The light-extracting features such as light-scattering features may be located on an upper surface and/or on an opposing lower surface of light guide plate 78.

Light 74 that is extracted from light guide plate 78 toward a viewer such as viewer 48 may serve as backlight 44 for display 14. Light 74 that scatters downwards may be reflected back in the upwards direction by reflector 80. Reflector 80 may be formed from a reflective material such as a layer of white plastic, other shiny materials, or from stacked layers of dielectric materials having relatively different indices of refraction (e.g., high and low indices of refraction) that cause reflection of light.

To enhance backlight performance for backlight structures 42, backlight structures 42 may include optical films 70. Optical films 70 may include diffuser layers for helping to homogenize backlight 44 and thereby reduce spatial non-uniformities/defects or hot spots, compensation films for enhancing off-axis viewing, and prism films (also sometimes referred to as turning films) for collimating backlight 44. Optical films 70 may overlap the other structures in backlight unit 42 such as light guide plate 78 and reflector 80. For example, if light guide plate 78 has a rectangular footprint when viewed in direction 50 of FIG. 5 (i.e., when viewed as a top view), optical films 70 and reflector 80 may have a matching rectangular footprint.

Figure 6:
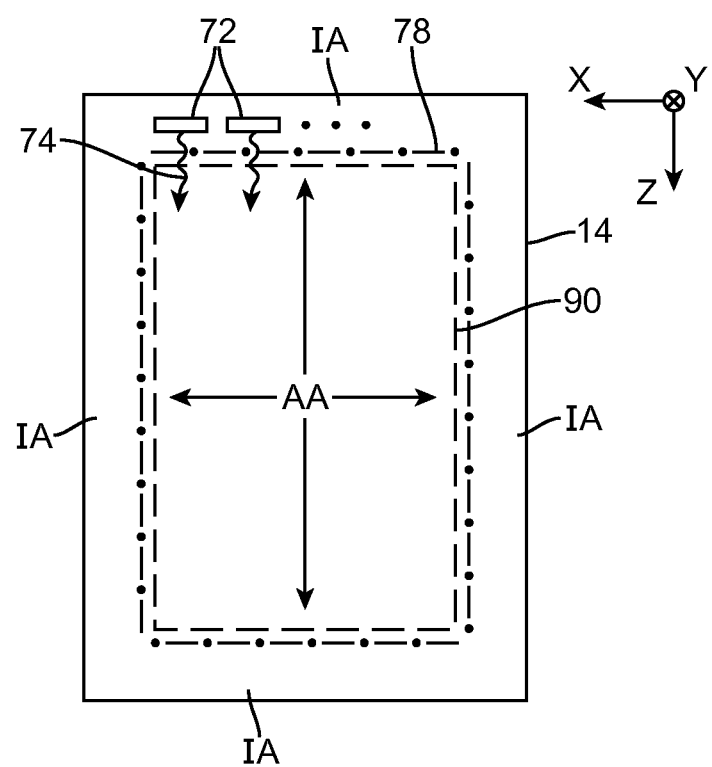
FIG. 6 is a top view of backlight structures for a display in accordance with an embodiment of the present invention.

As shown in the top view of display 14 of FIG. 6, display 14 may be characterized by a central rectangular active area AA (defined by dashed rectangular line 90) and an inactive border region (inactive area IA) that surrounds the periphery of active area AA. In active region AA, thin-film transistor layer 58 may contain an array of display pixels. Each display pixel may include electrode structures. Each display pixel may also include a thin-film transistor for controlling the amount of electric field that is applied to liquid crystal layer 52 by the electrode structures. During operation, gate line signals and data lines signals that are provided to the array of display pixels may be used to display images on display 14 for viewer 48.

Backlight for display 14 may be generated by an array of light-emitting diodes 72. Light-emitting diodes 72 may run along the upper edge of light guide plate 78 as shown in FIG. 6. If desired, more than one array of light-emitting diodes may be used to generate backlight. For example, in larger displays, it may be desirable to inject light from opposing edges of light guide plate 78. With this type of configuration, light 74 may be generated using opposing upper and lower rows of light-emitting diodes or light-emitting diode arrays that run along the opposing left and right edges of light guide plate 78 (as examples). Backlight configurations for display 14 in which there are more than two arrays of light-emitting diodes may also be used. The configuration of FIG. 6 in which light 74 is provided by a single row of light-emitting diodes that runs along the upper edge of light guide plate 78 is merely illustrative.

It may be desirable to minimize the size of inactive area IA. For example, it may be desirable to minimize the size of inactive area IA on the right and left of display 14 of FIG. 6 to allow display 14 to fill more of the front face of device 10. It may also be desirable to minimize the size of inactive area IA on the top and bottom edges of display 14 to provide more interior space for internal components in device 10 (e.g., antennas, buttons, speakers, integrated circuits, etc.). Reductions in the thickness of backlight structures such as light guide plate (i.e., in vertical direction 50 of FIG. 5) may also be helpful. For example, thin backlight structures may allow the overall thickness of device 10 and display 14 to be minimized, thereby reducing device weight and bulk for a user or may allow additional space for other electronic components such as a battery.

Figure 7:
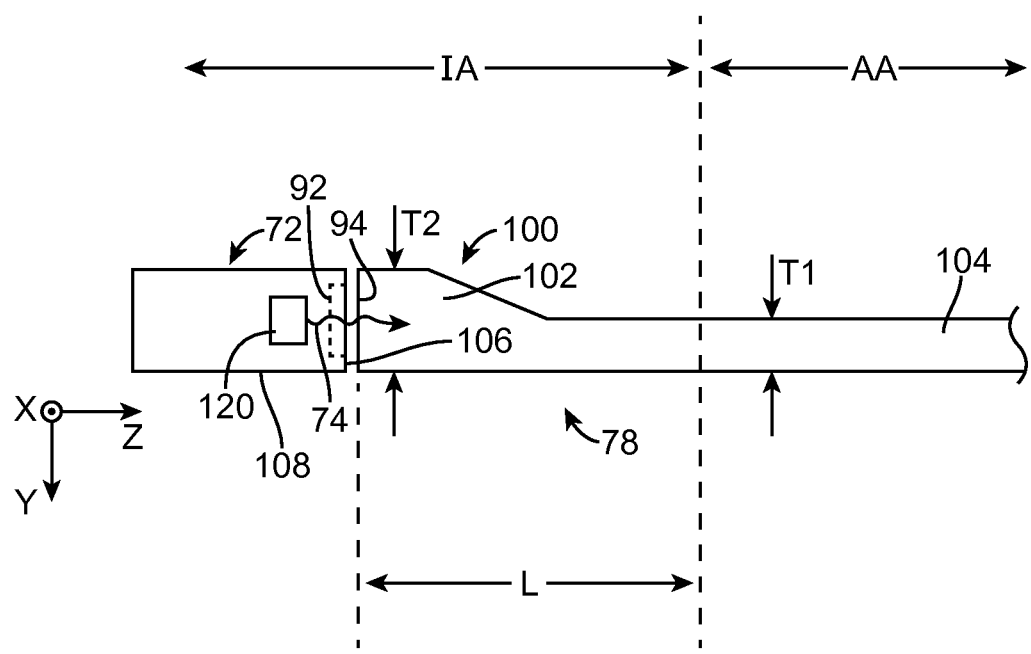
FIG. 7 is a cross-sectional side view of an illustrative light guide plate and an associated light-emitting diode that is injecting light into an edge of the light guide plate in accordance with an embodiment of the present invention.

If desired, light guide plate 78 may be implemented using a structure of the type shown in FIG. 7. With this type of configuration, light guide plate 78 may have a relatively thin planar portion 104 that overlaps active area AA. Light extracting structures such as bumps or pits may, if desired, be formed on the upper and/or lower surfaces of planar light guide portion 104 to enhance scattering of light 74 upwards as backlight 44.

Light guide plate 78 may, in general, be formed from a clear substance such as glass or plastic. Plastic molding techniques, roll-to-roll film fabrication techniques, or other fabrication techniques may be used in forming polymer light guide plates. To help minimize the size of thickness T1 (e.g., to a value of less than 0.4 mm, less than 0.3 mm, less than 0.25 mm, less than 0.2 mm, or less than 0.1 mm) it may be desirable to form light guide plate 78 from a polymer film (e.g., a flexible thin sheet of plastic that is formed using a roll-to-roll manufacturing process rather than a molding process). Configurations in which display 14 is formed using roll-to-roll film-based light guide plates are sometimes described herein as an example. This is, however, merely illustrative. Display 14 may use light guide plates formed by plastic molding, glass fabrication techniques, or other fabrication methods, if desired.

Locally thickened portion 100 of light guide plate 78 may be formed along the edge of light guide plate that is adjacent to light-emitting diodes 72. Portion 102 may be formed by stamping, molding, embossing, adding thermoplastic material to portion 104 using heat, laminating additional film material, adding clear adhesive to light guide plate portion 104, or by otherwise enhancing the thickness of the light guide plate (e.g., to produce a thickness T2 that is greater than thickness T1). Thickness T2 may be, for example, 0.1 to 0.6 mm, less than 1 mm, or more than 0.2 mm.

As shown in FIG. 7, light-emitting diode 72 may have a package body such as package body 108. Package body 108, which may sometimes be referred to as a package, may be formed from a molded thermoplastic, ceramic, or resin (as examples). Light-emitting diode die 120 (e.g., a semiconductor device) may be used in producing light 74 that propagates in direction Z through package window 92. Window 92 may be formed from a material such as epoxy or other polymer that includes phosphorescent filler material (e.g., phosphor). The phosphorescent material may help turn relatively bluish output light from device 120 into white light for backlighting display 14. Window structures 92 may be formed on front edge 106 of light-emitting diode package 108. Windows such as window structures 92 may encapsulate the die and phosphor, thereby allowing light generated from those two components to propagate outside of package 108 into air. Light 74 may be emitted from front edge (face) 106 and may be injected into opposing edge (face) 94 of light guide plate 78.

Figure 8:
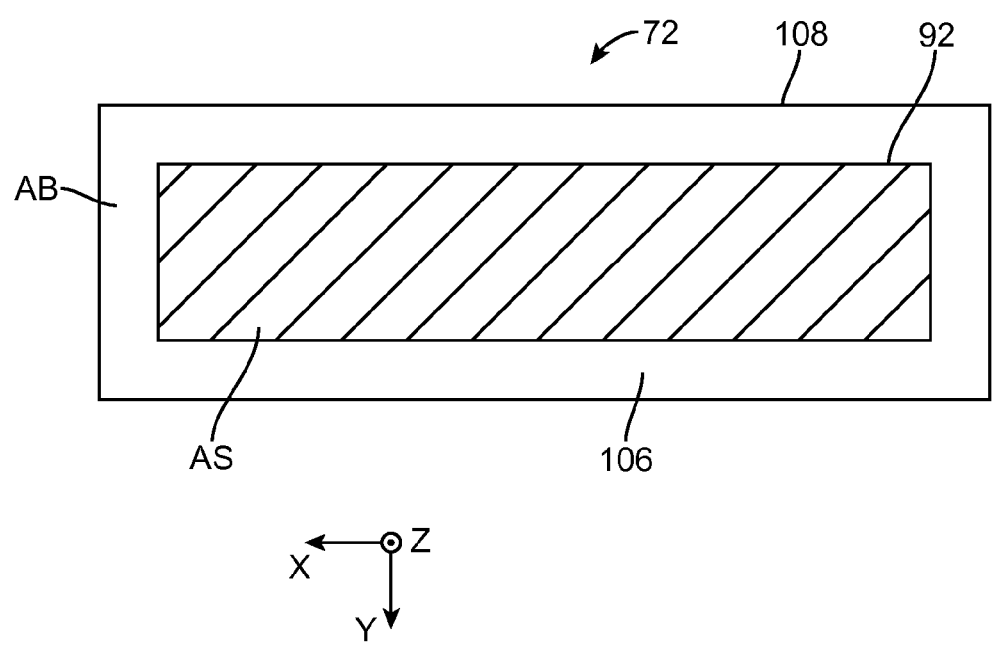
FIG. 8 is a front view of an illustrative packaged light-emitting diode in accordance with an embodiment of the present invention.

Particularly in scenarios in which light guide plate 78 is characterized by a relatively small thickness, challenges may arise in ensuring that backlight 44 is sufficiently bright. To help ensure adequate brightness for backlight 44, it may be desirable to use a relatively large window size for window 92. As shown in FIG. 8, window 92 may have a rectangular shape and may occupy an area AS on front face 106 of package 108. The total area of front face 106 (i.e., front face area AB) is equal to central window area AS plus the area of the front face portion of plastic package 108 that surrounds window 92. To help enhance backlight power, it may be desirable to ensure that area AS divided by area AB is greater than 0.5, greater than 0.7, greater than 0.8, or greater than 0.9 (as examples). Other configurations for light-emitting diode package 108 may also be used, if desired (e.g., arrangements in which window area AS divided by total area AB is less than 0.5. The use of configurations for light-emitting diode 72 in which area AS divided by area AB is greater than 0.5 are merely illustrative.

The width of inactive border region IA in the vicinity of light-emitting diodes 72 is affected by the homogeneity of light 74 within light guide plate 78 in the vicinity of edge 94. When first launched into light guide plate 78 from light-emitting diodes 72, light 74 is concentrated. Unless light 74 is allowed to propagate for a distance in light guide plate 78 before entering under active area AA of display 14, undesirable hotspots may be visible to viewer 48 (e.g., bright or dark zones (or alternating bright and dark zones) around the exit of each light-emitting diode).

One way in which to enhance light mixing within light guide plate 78 involves the use of light mixing features 110 along edge 94 of light guide plate 78. Light mixing features 110 may be formed by molding features 110 into plate 78 (e.g., using a mold having features complimentary to features 110 for producing many similar plates 78), by patterning clear adhesive along edge 94, by cutting grooves or other features into edge 94 (e.g., using a corrugated die), by laser trimming edge 94, or by patterning edge 94 using other suitable manufacturing processes. Features 110 may, for example, take the form of vertical grooves running parallel to dimension Y.

In film-based light guide plates, it may be challenging to form light mixing features that are sufficiently clean (i.e., optically smooth) to avoid lossy backscattering. Accordingly, it may be desirable to form edge 94 using a straight die cut, laser cut, or slit cut, so that edge 94 forms a planar surface lying in the X-Y plane of FIG. 9.

Figure 9:
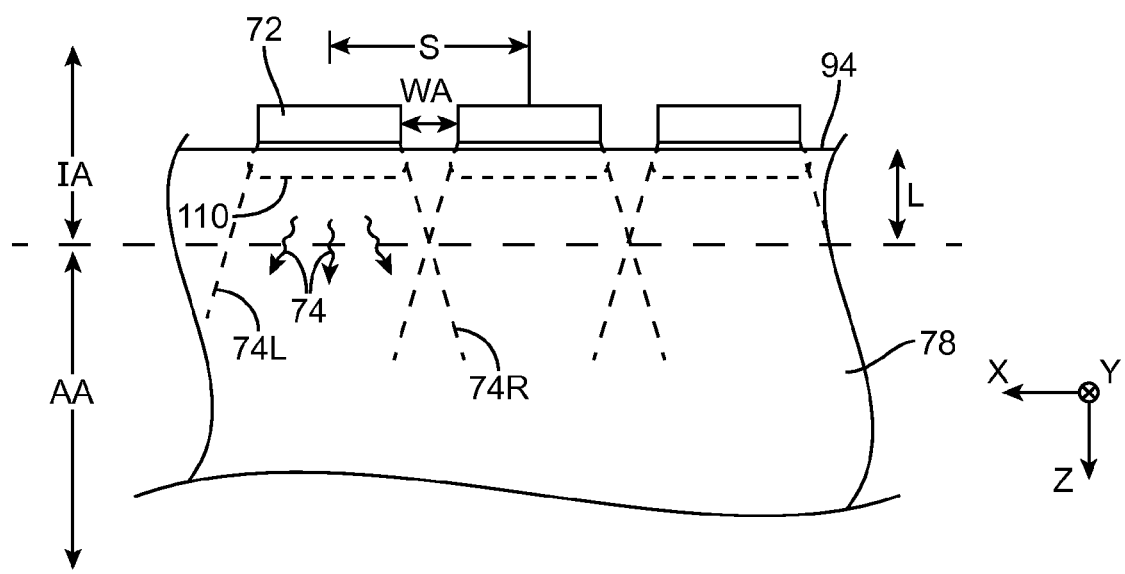
FIG. 9 is a top view of an illustrative light guide plate and an associated array of light-emitting diodes for providing backlight in a display in accordance with an embodiment of the present invention.

When injecting light into light guide plate 78 in a configuration in which edge 94 is planar (and even in other configurations), care should be taken that there is a sufficient mixing distance L for propagating light 74 within light guide plate 78 before using the scattered backlight from light guide plate 78 to serve as backlight for active area AA. The minimum suitable distance before light 74 has mixed sufficiently to be used as display backlight 44 is sometimes referred to as the mixing distance for light guide plate 78. As shown in FIG. 9, mixing distance L is the distance between edge 94 and the edge of active area AA.

Diodes 72 emit light with an angular spread (in the X-Z plane). For example, light 74 may be emitted within a cone that is bounded on the left by light ray 74L and on the right by light ray 74R. Light rays 74L and 74R may be determined by the critical angle of the material for a flat input face of edge 94. Under this assumption, all light emitted from diodes 72 will be emitted within the angles indicated by rays 74L and 74R. (Angular spread in the Y dimension is limited by the relatively narrow separation between the upper and lower surfaces of light guide plate 78).

The value of mixing distance L is affected by the angular spread of light 74 and light-emitting diode center-to-center spacing S. When there are relatively large gaps WA between adjacent diodes 72, the center-to-center spacing S of diodes 72 will be relatively large and (for a given angular spread of emitted light 74), a relatively larger value of L will be needed to adequately mix light 74 before using light 74 as backlight for active area AA. Larger values of WA will therefore lead to larger values of L and more inactive border for display 14. To reduce the size of mixing length L and thereby reduce the size of the inactive border region IA for the portion of display 14 bordered by light-emitting diodes 72, the minimum value of diode-to-diode separation WA for the diodes in the array of diodes that runs along the length of edge 94 may be minimized.

Figure 10:
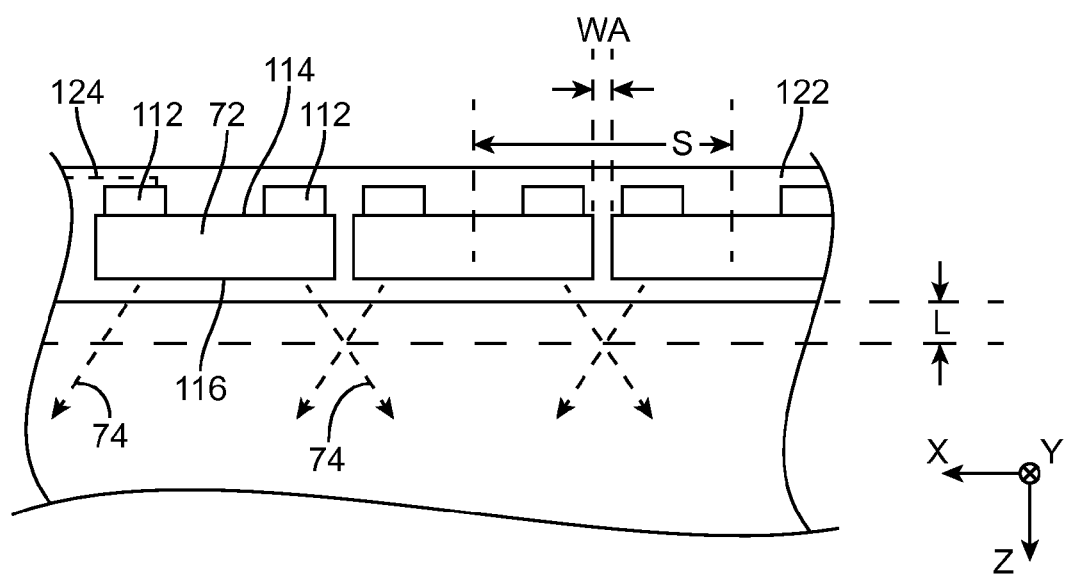
FIG. 10 is a top view of a portion of a light guide plate showing how reduced diode-to-diode spacing in an array of light-emitting diodes may help minimize mixing distance in the light guide plate in accordance with an embodiment of the present invention.

To help minimize diode-to-diode separation WA between the packages of adjacent diodes 72, diodes 72 may be provided with terminals 112 that extend out of the rear of diodes 72 (in direction −Z), as shown in FIG. 10, rather than terminals that extend out of the sides of the diodes (in directions +/−X) as with conventional light-emitting diode packages for backlights. As shown in FIG. 10, small values of WA tend to reduce the diode center-to-center spacing S and thereby help light cones 74 from adjacent diodes 72 overlap and produce homogeneous light 74 within a relatively small mixing distance L.

Terminals 112 may include positive and negative power supply terminals. A power supply signal may be supplied across the positive and negative terminals for each diode 72 to adjust the power of the emitted light from that diode. Light-emitting diodes 72 may be mounted on a substrate such as substrate 122. Substrate 122 may be a dielectric material. For example, substrate 122 may be a rigid printed circuit board (e.g., a printed circuit board formed from fiberglass-filled epoxy such as an FR4 board) or may be a flexible printed circuit (e.g., a printed circuit formed from a flexible sheet of polyimide or a layer of other flexible polymer). Metal traces such as illustrative trace 124 of FIG. 10 may be formed on substrate 122 to provide power to terminals 112 of light-emitting diodes 72.

Terminals 112 may be formed from bent metal structures of the type that are sometimes referred to as lead frames. A lead frame structure may be formed from a stenciled metal sheet. A lead frame package for diodes 72 may be formed by bending a sheet of patterned lead frame metal into a desired shape, overmolding a thermoplastic to form housing 108, attaching die 120 to the lead frame structures using epoxy or a eutectic die attach material (e.g., solder), forming electrical connections between die 120 and respective lead frame structures (e.g., by using positive and ground wire bond wires or solder bumps on die 120 to form electrical paths to respective positive and ground terminal lead frame structures), and by forming window structure 92 in package 108 by filling a window-shaped recess within package 108 with a phosphorescent material such as epoxy with a phosphor filler.

Figure 11:
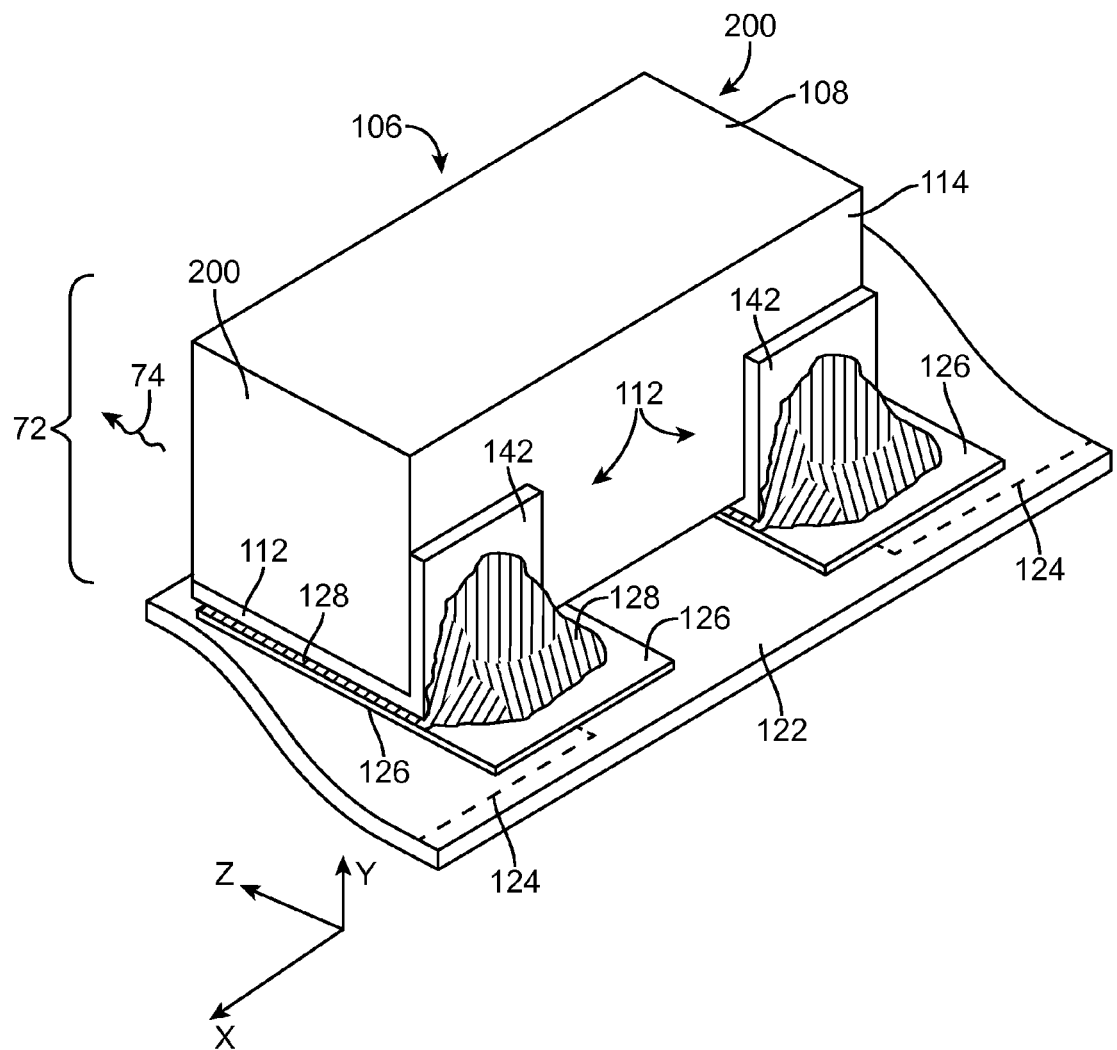
FIG. 11 is a rear perspective view of an illustrative packaged light-emitting diode showing how lead frame terminals may be wrapped under and around the back of a light-emitting diode to allow the light-emitting diode to be mounted close to another light-emitting diode in an array of light-emitting diodes of the type shown in FIG. 10 in accordance with an embodiment of the present invention.

A perspective view showing an illustrative configuration for light-emitting diodes 72 is shown in FIG. 11. As shown in the rear perspective view of FIG. 11, diode 72 may have lead frame structures 112 with rear portions 142 that lie flush with rear surface 114 of package 108. There may, for example, be a pair of portions 142 that serve as positive and ground terminals for light-emitting diode 72. Portions of lead frame structures 112 may also be formed on the lower surface of package 108. Solder 128 may be interposed between these lower portions of lead frame structures 112 and may be used in soldering light-emitting diode 72 to substrate 122 (e.g., to solder lead frame structures 112 to solder pads 126 and other traces 124 on substrate 122). Solder 128 may extend between the portions of lead frame structures 112 that lie on the lower surface of package 108 and solder pad traces 126 on substrate 122, thereby forming an electrical and mechanical connection between light-emitting diode 72 and substrate 122. Some solder 128 may wick up the rear face of diode 72 (e.g., by wicking up and covering some or all of rear terminal portions 142 of lead frame structures 112 to form solder fillets of the type shown in FIG. 11). Because end faces 200 of diode package 108 may be maintained partly or completely free of lead frame structures 112, no lead frame structures need be interposed between diode 72 and adjacent diodes in the array of light-emitting diodes that is being used to provide light 74 to light guide plate 78. As a result, the size of gap WA between the opposing end faces of diodes 72 in the array can be minimized to reduce mixing distance L.

Figure 12:
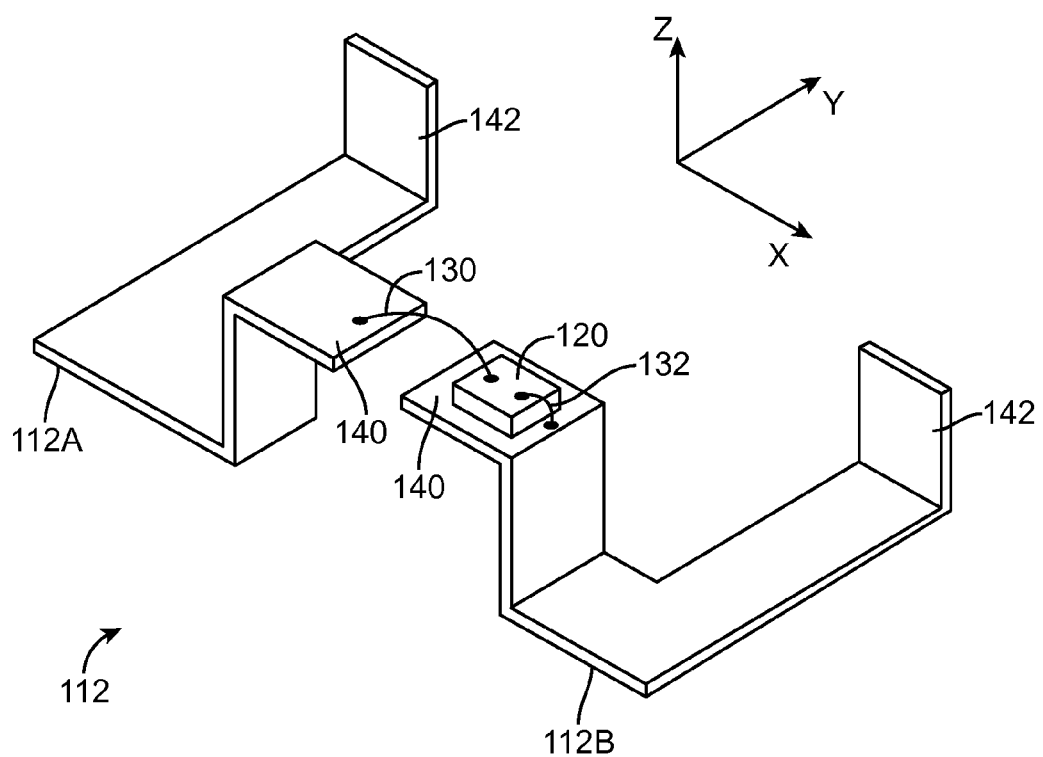
FIGS. 12, 13, and 14 are perspective views of illustrative lead frame configurations that may be used in forming a packaged light-emitting diode of the type shown in FIG. 11 in accordance with an embodiment of the present invention.
Figure 13:
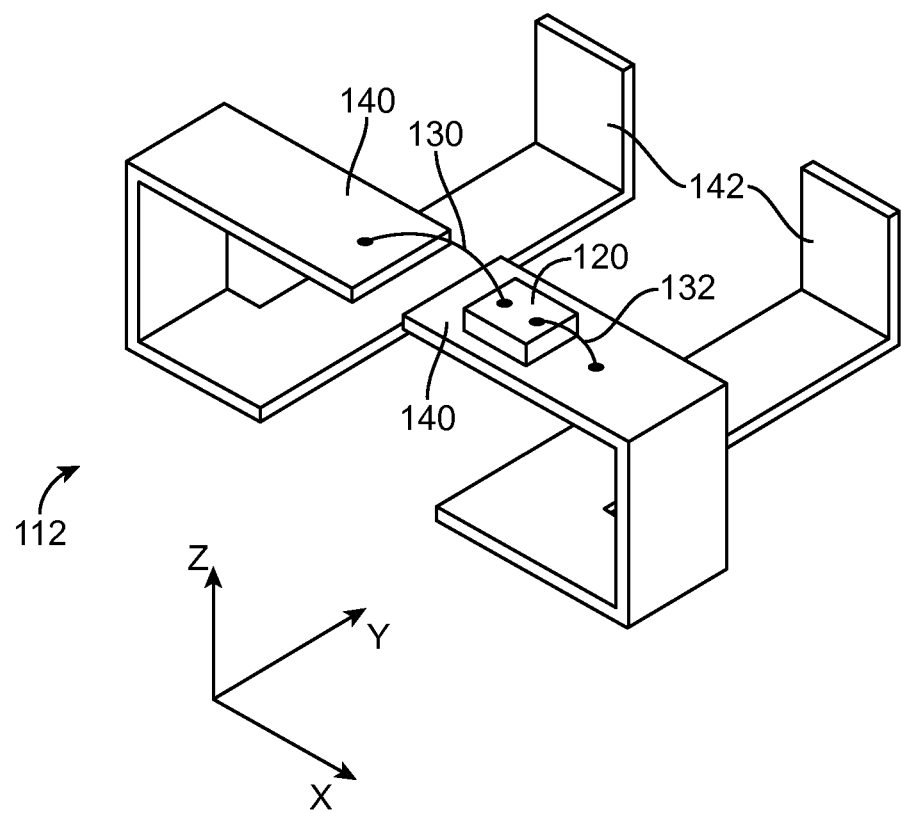
Figure 14:
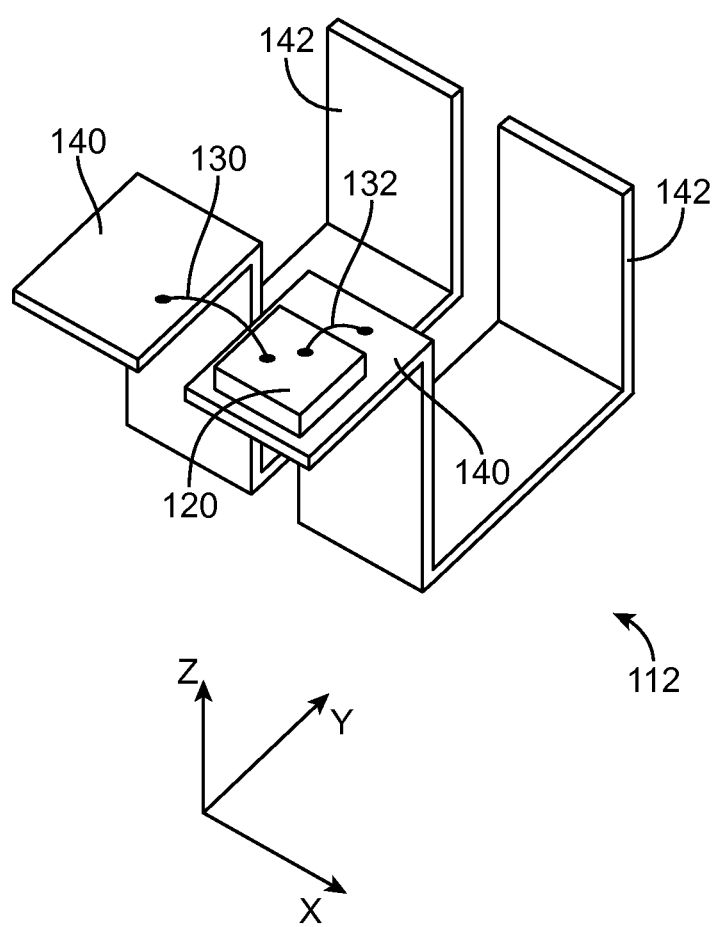

Any suitable shape may be used for lead frame structures 112 so long as rear terminals 142 are formed to maintain some or all of the end faces of diodes 72 free of undesired bulky lead frame structures. FIGS. 12, 13, and 14 show illustrative configurations that may be used in forming a pair of lead terminal structures. As shown in FIG. 12, lead frame structures 112 may have a first structure 112A and a second structure 112B. Diode die 120 may be mounted on horizontal mounting surface 140 of structure 112B. Wire bond 132 may electrically couple one of the diode's terminals to lead frame structure 112B. Wire bond 130 may be used to connect another of the diode's terminals to surface 140 of lead frame structure 112A. Structures 112A and 112B may be bent outwards and backwards as shown in FIG. 12 to form planar rear surface terminal structures 142, lying in the X-Z plane (e.g., on rear face 114 of diode package 108 in a configuration of the type shown in FIG. 11).

In the illustrative arrangement of FIG. 13, lead frame structures 112 have been bent inward and backwards to form rear terminals 142.

In the illustrative arrangement of FIG. 14, lead frame structures 112 have been bent backwards to form lead frame rear terminals 142.

Other types of lead frame configurations may be used in forming a package for light-emitting diodes 72 if desired. The configurations of FIGS. 12, 13, and 14 are merely illustrative.

Figure 15:
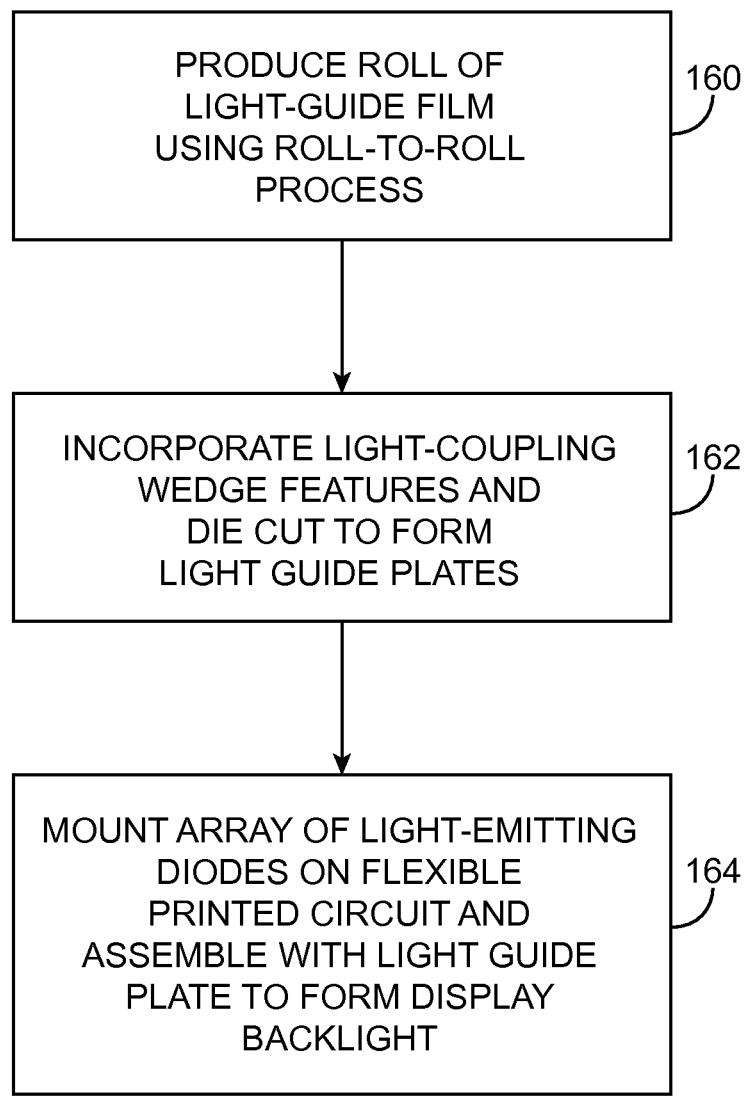
FIG. 15 is a flow chart of illustrative steps involved in forming an electronic device having display backlight structures in accordance with an embodiment of the present invention.

FIG. 15 is a flow chart of illustrative steps involved in forming display 14 and device 10. During the operations of step 160, a thin layer of transparent material for light guide plate 78 may be formed (e.g., using a roll-to-roll process). Light guide plate 78 may be, for example, a thin polymer film having a thickness of less than 0.4 mm, less than 0.3 mm, less than 0.25 mm, less than 0.2 mm, greater than 0.1 mm, or other suitable thickness.

During the operations of step 162, wedge portion 110 (e.g., a thickened edge portion) of light guide plate 78 may be formed. For example, additional polymer may be formed on an edge portion of the film of polymer that was produced using the roll-to-roll process of step 160. Features for scattering light such as light mixing features 110 may be incorporated into the edge of light guide plate 78 or may be omitted (e.g., to minimize light scattering of the type that may reduce backlight efficiency).

At step 164, light-emitting diodes 72 (e.g., light-emitting diodes with terminal-free end faces and rear and lower surfaces having exposed portions of lead frame structures) may be mounted on substrate 122 using solder 128. The spacing (gap) WA between respective adjacent diodes (e.g., between opposing end faces 200) may be minimized (e.g., to less than 2 mm, less than 1 mm, less than 0.5 mm, less than 0.25 mm, or less than 0.125 mm, as examples). The width of each package (along dimension X) may be, as an example, 1-8 mm, more than 1 mm, less than 8 mm, 3-5 mm, or other suitable size. The lateral dimensions of the solder fillet formed by solder 128 at the rear of package 108 may be about 0.5 to 3 mm or less than 3 mm (as examples). The spacing between solder pads 126 may be about 1-10 mm, less than 2 mm, less than 1 mm, less than 0.2 mm, less than 10 mm, or more than 1 mm (as examples).

Although lead frame terminals 142 have been depicted in FIG. 11 as being formed in the left rear and right rear corners of package 108, terminals 142 may, if desired, be formed at intermediate locations along the rear surface of package 108, if desired (e.g., to provide more lateral spacing between the solder connections associated with adjacent light-emitting diodes.

Figure 16:
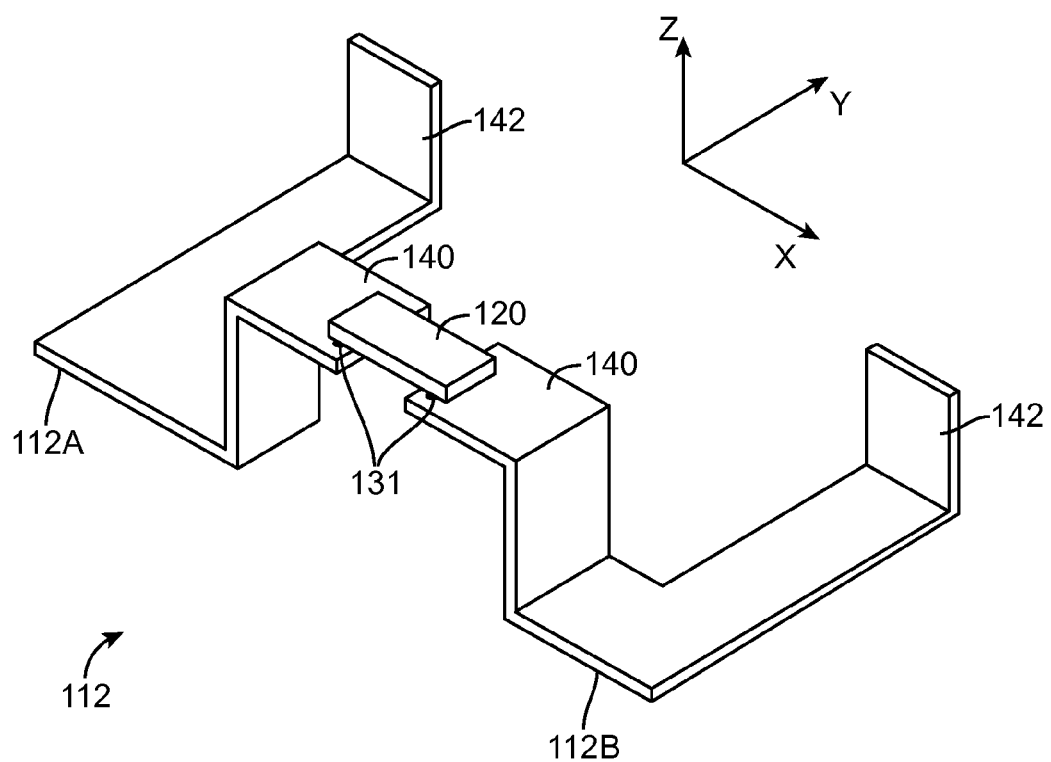
FIG. 16 is a perspective view of an illustrative lead frame configuration that may be used in forming a packaged light-emitting diode of the type shown in FIG. 11 in accordance with an embodiment of the present invention.

FIG. 16 shows an illustrative configuration that may be used in forming a pair of lead terminal structures that connect to a diode die such as die 120 that has been implemented using a flip-chip arrangement. As shown in FIG. 16, first lead frame structure 112A and a second lead frame structure 112B may each be coupled to solder bumps 131 on a bottom surface of die 120. Diode die 120 may be mounted on horizontal mounting surfaces 140 of structures 112A and 112B. Solder bumps 131 may electrically couple one of the diode's terminals to lead frame structure 112B and another of the diode's terminals to surface 140 of lead frame structure 112A. Structures 112A and 112B may be bent outwards and backwards as shown in FIGS. 12 and 16, may be bent as shown in FIG. 13 or 14, or may be bent into other suitable configurations for forming planar rear surface terminal structures 142, lying in the X-Z plane (e.g., on rear face 114 of diode package 108 in a configuration of the type shown in FIG. 11).

Figure 17:
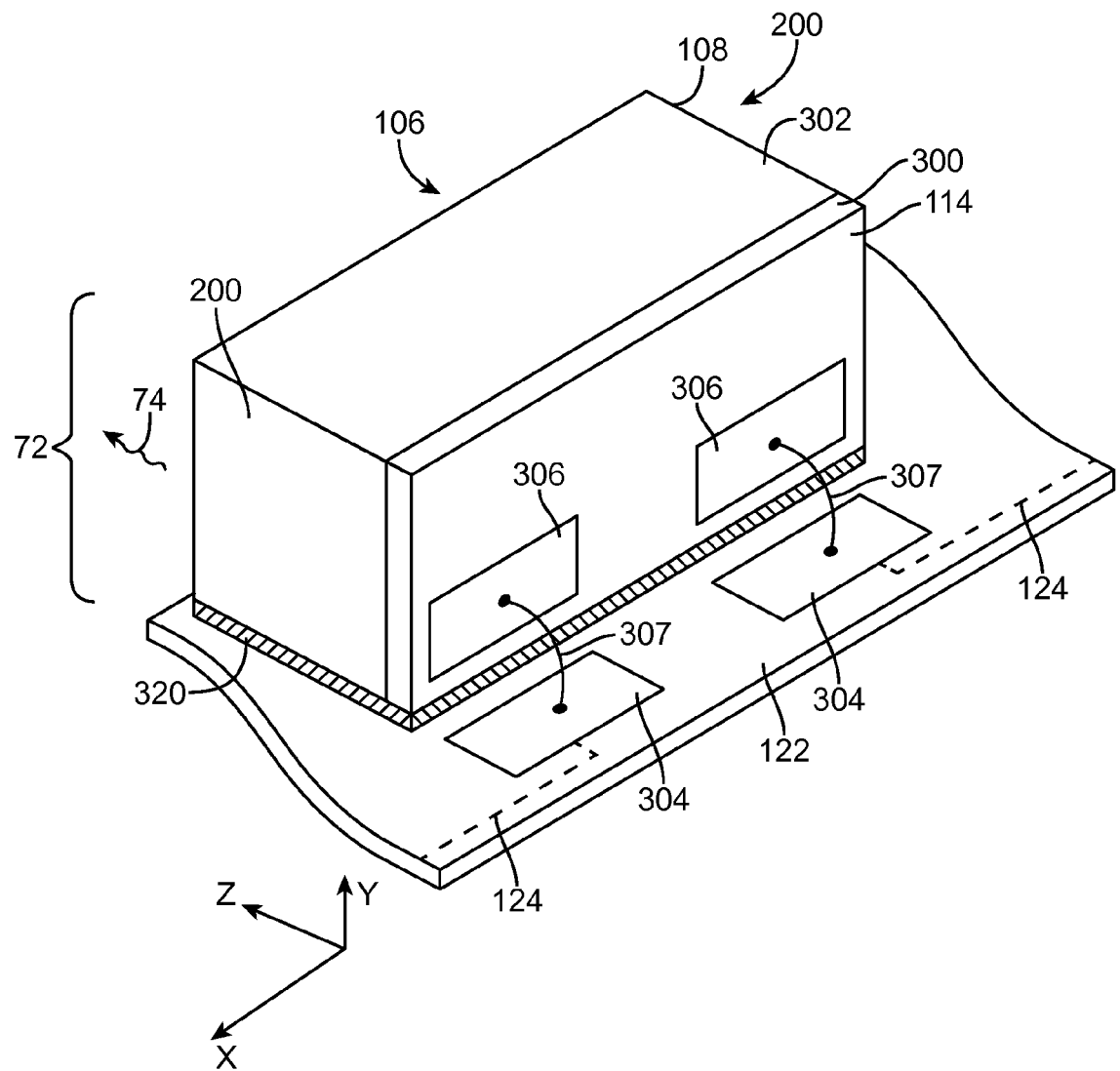
FIG. 17 is a rear perspective view of an illustrative packaged light-emitting diode showing how electrical contacts may be formed on a rear surface of a chip-on-board package to allow the light-emitting diode to be mounted close to another light-emitting diode in an array of light-emitting diodes of the type shown in FIG. 10 in accordance with an embodiment of the present invention.

The examples of FIGS. 11, 12, 13, 14, and 16 in which light-emitting diode 72 is formed from a semiconductor device that is mounted to lead frame structures in a plastic package are merely illustrative. If desired, light-emitting diode 72 may be formed as a chip-on-board package such as a chip-on-ceramic package with attached light-redirecting structures as in the example of FIG. 17. As shown in FIG. 17, light-emitting diode 72 may be formed on a substrate such as substrate 300 (e.g., a ceramic substrate having electrical interconnects and other electrical components in a layered circuit stack).

Substrate 300 may, for example, be a printed circuit board having a light-emitting component attached to the printed circuit board or formed as an integrated component of the printed circuit board.

Substrate 300 may include electrical contacts 306 that lie flush with rear surface 114 of package 108. There may, for example, be a pair of contacts 306 that serve as positive and ground terminals for light-emitting diode 72.

Wire bonds 307 may be coupled between contacts 306 on substrate 300 and electrical contacts 304 on substrate 122, thereby forming an electrical connection between light-emitting diode 72 and substrate 122.

In configurations in which diode 72 includes a chip-on-board semiconductor device such as substrate 300, substrate 300 may be attached to light-redirecting structures 302. Light-redirecting structures 302 may include an opaque plastic, metal, resin, or ceramic wall that at least partially surrounds a light-emitting portion of substrate 300. Structures 302 may be partially or completely filled with material that forms a window such as window 92 (FIG. 8) on front face 106 of diode 72 that allows light 74 to escape from diode 72. However, this is merely illustrative. If desired, structures 302 may be formed from a molded encapsulant dome over the light emitting-portion of substrate 300 that allows light 74 to escape from front face 106 of diode 72.

In configurations in which diode 72 includes a chip-on-board semiconductor device such as substrate 300, diode 72 may be mechanically attached to substrate 72 using adhesive 320. Adhesive 320 may be a pressure-sensitive adhesive, a light-cured adhesive, or other suitable adhesive.

In the example of FIG. 17, because end faces 200 of diode package 108 may be maintained partly or completely free of lead frame structures 112 or electrical contacts 306, no structures need be interposed between diode 72 and adjacent diodes in the array of light-emitting diodes that is being used to provide light 74 to light guide plate 78. As a result, the size of gap WA between the opposing end faces of diodes 72 in the array can be minimized to reduce mixing distance L.

Figure 18:
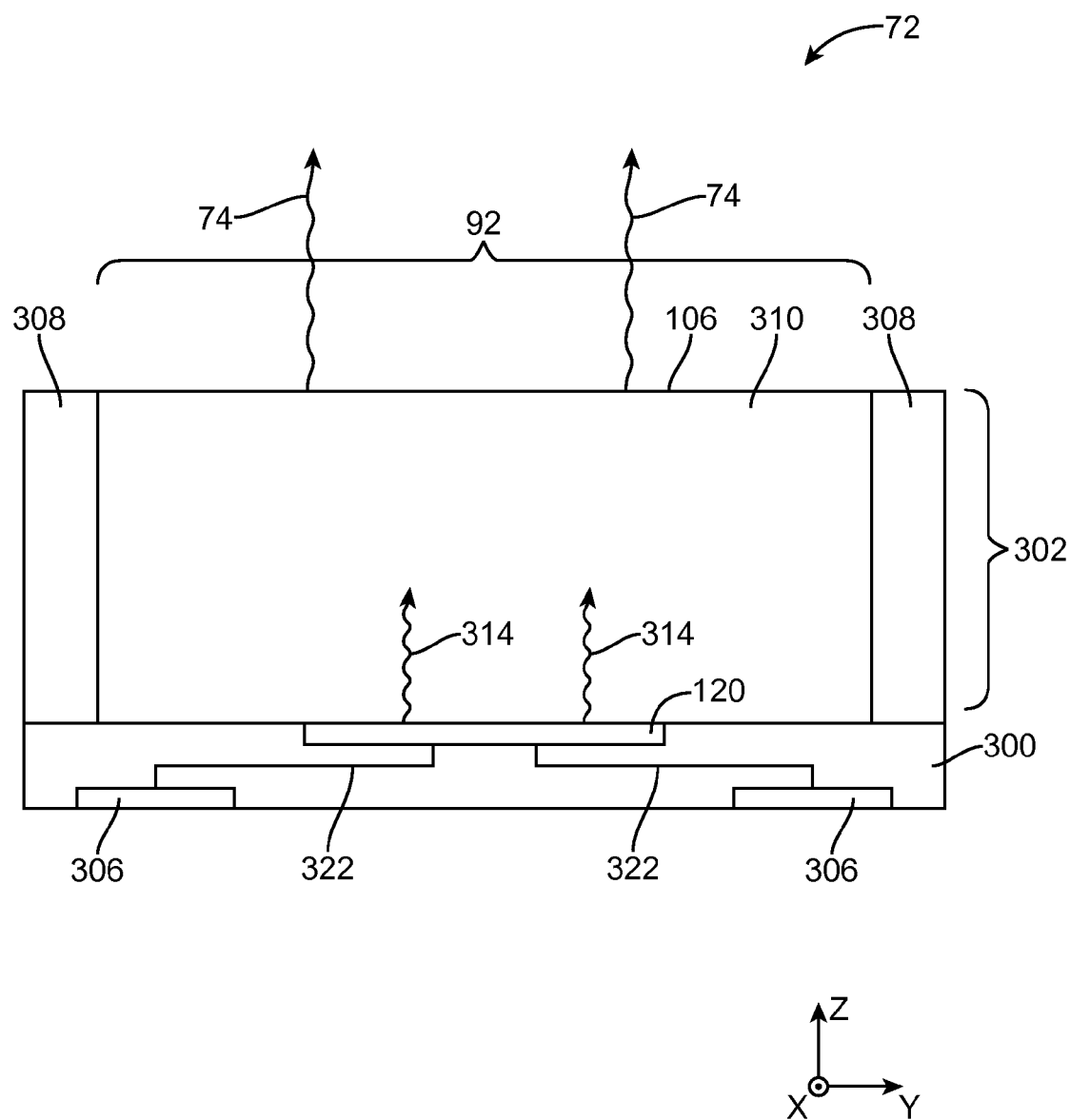
FIG. 18 is a cross-sectional side view of a chip-on-board package of the type shown in FIG. 17 in accordance with an embodiment of the present invention.

FIG. 18 shows a cross-sectional side view of diode 72 of FIG. 17 showing how substrate 300 may include semiconductor device 120 that is attached to substrate 300 (e.g., using solder) or that is formed as an integrated portion of chip-on-board substrate 300. Substrate 300 may be formed from ceramic, metal, layers of dielectric and conductive materials, etc. Substrate 300 may be a printed circuit substrate that includes conductive interconnects 322 that couple contacts 306 to semiconductor device 120. Semiconductor device 120 may emit light 314. Light 314 may be released directly from device 120 or may interact with filler material 310 prior to exiting diode 72 from front face 106.

Filler material 310 may be formed between wall structures 308 that are attached to substrate 300 to form window (also see, e.g., FIG. 8). Wall structures 308 may be formed from plastic, metal, resin, ceramic or other materials. Wall structures 308 and printed circuit substrate 300 may form a cavity. Filler material 310 may be formed in the cavity so that wall structures 308 at least partially surround window 92. Filler material 310 may include epoxy or other polymer that includes phosphorescent filler material (e.g., phosphor). The phosphorescent material may help turn relatively bluish output light from device 120 into white light for backlighting display 14. Window structures 92 may extend from substrate 300 to front edge 106 of light-emitting diode package 108. Light 74 may be emitted from front edge (face) 106 and may be injected into an opposing edge of light guide plate 78 (see, e.g., FIG. 7).

The foregoing is merely illustrative of the principles of this invention and various modifications can be made by those skilled in the art without departing from the scope and spirit of the invention.

What is claimed is:

1. Display backlight structures, comprising:
    a light guide plate having an edge;
    a dielectric substrate layer having solder pads; and
    light-emitting diodes arranged in a row along the edge that emit light into the edge, wherein each light-emitting diode includes a package having opposing front and rear surfaces, wherein each light-emitting diode includes first and second lead frame structures and a semiconductor device mounted to and wirebonded to one of the lead frame structures, wherein the package comprises a plastic body that covers at least some of the first and second lead frame structures, wherein the front surface comprises a window through which the light is emitted, wherein the plastic body further comprises a lower surface on which portions of the first and second lead frame structures are formed, wherein the plastic body further comprises opposing end faces that are free of lead frame structures, wherein the light-emitting diodes are soldered to the dielectric substrate layer by soldering the portions of the first and second lead frame structures on the lower surface to the solder pads with solder, and wherein the lead frame structures include lead frame terminals on the rear surface.

2. The display backlight structures defined in claim 1 wherein the light guide plate comprises a polymer film.

3. The display backlight structures defined in claim 2 wherein the polymer film comprises a rectangular sheet of roll-to-roll film having an edge that forms a planar surface that is free of light mixing feature and wherein the edge runs along substantially all of the light guide plate.

4. The display backlight structures defined in claim 1 wherein the light guide plate has a planar portion with a thickness of less than 0.3 mm.

5. The display backlight structures defined in claim 1 wherein the window has a window surface area, wherein the front surface has a front surface area, and wherein the window surface area divided by the front surface area is greater than 0.7.

6. The display backlight structures defined in claim 5 wherein the semiconductor device is coupled to the first lead frame structure with a first wire bond and is coupled to the second lead frame structure with a second wire bond.

7. The display backlight structures defined in claim 6 wherein the first lead frame terminal comprises a planar surface to which the semiconductor device is attached and wherein the plastic body is molded over at least some of the lead frame structures.

8. The display backlight structures defined in claim 7 wherein the window structures includes phosphorescent filler material.

9. The display backlight structures defined in claim 8 wherein portions of solder that have wicked up at least part of the lead frame terminals on the rear surface of each package solders the lead terminals on the rear surface to the solder pad traces.

10. Display backlight structures, comprising:
    a light guide plate having an edge; and
    light-emitting diodes arranged in a row along the edge that emit light into the edge, wherein each light-emitting diode includes a package having opposing front and rear surfaces, wherein each light-emitting diode includes lead frame structures, wherein the lead frame structures include lead frame terminals on the rear surface, and wherein each package has at least one end face that is free of lead frame structures and that is separated from an end face of an adjacent one of the packages by a gap of less than 1 mm.

11. The display backlight structures defined in claim 10 wherein the printed circuit substrate comprises a flexible printed circuit substrate.

12. Display backlight structures, comprising:
    a light guide plate having an edge;
    a printed circuit substrate; and
    an array of light-emitting diodes that are mounted to the printed circuit substrate along the edge of the light guide plate and that emit light into the edge of the light guide plate, wherein each light-emitting diode includes a semiconductor device and a package having a plastic body with a front surface with a window from which the light is emitted and a rear surface, wherein each package has lead frame structures on the rear surface, and wherein the semiconductor device is mounted to and electrically connected to at least one of the lead frame structures, and wherein each package has at least one end face that is free of lead frame structures and that is separated from an end face of an adjacent one of the packages by a gap of less than 1 mm.

13. The display backlight structures defined in claim 12 further comprising solder pads on the printed circuit substrate, wherein the light-emitting diodes are soldered to the solder pads with solder.

14. The display backlight structures defined in claim 13 wherein the plastic body of each light-emitting diode includes a lower surface, wherein the lead-frame structures comprise lead frame portions on the lower surface that are soldered to the solder pads with the solder.

15. The display backlight structures defined in claim 14 wherein the lead frame structures for each light-emitting diode include a first lead frame structure having a planar portion on the lower surface and a planar portion on the rear surface and include a second lead frame structure having a planar portion on the lower surface and a planar portion on the rear surface, wherein the planar portions of the first and second lead frame structures are soldered to the solder pads with the solder.

16. A display, comprising:
    upper and lower polarizers;
    a thin-film-transistor layer between the upper and lower polarizers;
    a color filter layer interposed between the first and second polarizers;
    a layer of liquid crystal material interposed between the color filter layer and the thin-film-transistor layer;
    a light guide plate for providing backlight that travels through the upper and lower polarizers, the thin-film transistor layer, the color filter layer, and the layer of liquid crystal material, wherein the light guide plate has an edge;
    a dielectric substrate layer having solder pads; and an array of light-emitting diodes that emit light into the edge, wherein each light-emitting diode has first and second lead frame structures, a semiconductor device mounted to the first lead frame structure and wirebonded to the first and second lead frame structures, and a plastic body that covers at least some of the first and second lead frame structures, wherein the plastic body has a front surface with a window through which the light is emitted, an opposing rear surface, a lower surface on which portions of the first and second lead frame structures are formed, and opposing end faces that are free of lead frame structures, and wherein the array of light-emitting diodes are soldered to the dielectric substrate layer by soldering the portions of the first and second lead frame structures on the lower surface to the solder pads with solder.

17. The display defined in claim 16 wherein the first and second lead frame structures of each light-emitting diode comprise first and second respective lead frame terminal portions on the rear face of that light-emitting diode that are soldered to the solder pads with the solder.

18. The display defined in claim 17 wherein the window comprises a phosphorescent window material having a window surface, wherein the front surface has a front surface area, wherein the window surface occupies more than 80% of the front surface area, and wherein the light guide plate comprises a die cut sheet of roll-to-roll polymer film.

19. Display backlight structures, comprising:
 a light guide plate having an edge; and
 light-emitting diodes arranged in a row along the edge that emit light into the edge, wherein each light-emitting diode includes a package having opposing front and rear surfaces and having a printed circuit substrate that forms at least part of the rear surface of the package, wherein light is emitted into the edge of the light guide plate from the front surface, and wherein each light-emitting diode includes electrical contacts on the rear surface.

20. The display backlight structures defined in claim 19 wherein each package includes light-redirecting structures attached to the printed circuit substrate.

21. The display backlight structures defined in claim 20 wherein the electrical contacts on the rear surface comprise electrical contacts on the printed circuit substrate.

22. The display backlight structures defined in claim 20 wherein the light-redirecting structures comprise a window that extends to the front surface through which the light passes and a wall structure and wherein the window is formed from material that fills a cavity formed by the wall structure and the printed circuit substrate.

23. The display backlight structures defined in claim 19 wherein the printed circuit substrate has opposing first and second surfaces, wherein the first surface faces towards the edge of the light guide plate, wherein the second surface faces away from the edge of the light guide plate, and wherein the electrical contacts are formed on the second surface.

24. The display backlight structures defined in claim 23 wherein the light guide plate comprises opposing front and rear surfaces connected by the edge.

25. The display backlight structures defined in claim 24, further comprising a reflector positioned along the rear surface of the light guide plate.

* * * * *